(12) United States Patent
Gao et al.

(10) Patent No.: US 10,930,549 B2
(45) Date of Patent: Feb. 23, 2021

(54) CAP STRUCTURE

(71) Applicant: GLOBALFOUNDRIES INC., Grand Cayman (KY)

(72) Inventors: Jinsheng Gao, Clifton Park, NY (US); Daniel Jaeger, Saratoga Springs, NY (US); Chih-Chiang Chang, Clifton Park, NY (US); Michael Aquilino, Gansevoort, NY (US); Patrick Carpenter, Hanover, MD (US); Junsic Hong, Malta, NY (US); Mitchell Rutkowski, Ballston Spa, NY (US); Haigou Huang, Rexford, NY (US); Huy Cao, Rexford, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/573,209

(22) Filed: Sep. 17, 2019

(65) Prior Publication Data

US 2020/0013672 A1    Jan. 9, 2020

Related U.S. Application Data

(62) Division of application No. 15/882,291, filed on Jan. 29, 2018, now Pat. No. 10,460,986.

(51) Int. Cl.
*H01L 29/66* (2006.01)
*H01L 29/78* (2006.01)
(Continued)

(52) U.S. Cl.
CPC .. *H01L 21/76834* (2013.01); *H01L 21/28247* (2013.01); *H01L 21/31116* (2013.01);
(Continued)

(58) Field of Classification Search
CPC ............ H01L 21/76834; H01L 29/785; H01L 21/28247; H01L 29/6656; H01L 29/6653; H01L 21/76802; H01L 21/31116; H01L 29/66545; H01L 29/665; H01L 29/41791; H01L 29/66795; H01L 29/41775;
(Continued)

(56) References Cited

U.S. PATENT DOCUMENTS 9,679,813 B2   6/2017 Chen et al.
2013/0187203 A1   7/2013 Xie et al.
(Continued)

FOREIGN PATENT DOCUMENTS

CN    107452797    12/2017

OTHER PUBLICATIONS

German Office Action related DE Application No. 10 2018 208 451.3 dated Oct. 29, 2018, 8 pages.
(Continued)

*Primary Examiner* — David Vu
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a cap structure and methods of manufacture. The structure includes: a gate structure composed of conductive gate material; sidewall spacers on the gate structure, extending above the conductive gate material; and a capping material on the conductive gate material and extending over the sidewall spacers on the gate structure.

15 Claims, 4 Drawing Sheets

(51) Int. Cl.
   *H01L 21/768* (2006.01)
   *H01L 21/28* (2006.01)
   *H01L 21/311* (2006.01)
   *H01L 29/417* (2006.01)

(52) U.S. Cl.
   CPC .... *H01L 21/76802* (2013.01); *H01L 29/6653* (2013.01); *H01L 29/6656* (2013.01); *H01L 29/785* (2013.01); H01L 29/41775 (2013.01); H01L 29/41791 (2013.01); H01L 29/665 (2013.01); H01L 29/66545 (2013.01); *H01L 29/66795* (2013.01)

(58) Field of Classification Search
   CPC ......... H01L 21/76897; H01L 21/76804; H01L 21/76816; H01L 21/76879; H01L 23/5283; H01L 23/53271
   See application file for complete search history.

(56) References Cited

U.S. PATENT DOCUMENTS

| | | |
|---|---|---|
| 2016/0043186 A1 | 2/2016 | Liu et al. |
| 2017/0186849 A1 | 6/2017 | Chen et al. |
| 2017/0317079 A1 | 11/2017 | Kim et al. |

OTHER PUBLICATIONS

Taiwanese Office Action related TW Application No. 107146837 dated May 19, 2020, 3 pages.
Taiwanese Office Action related TW Application No. 107146837 dated Dec. 5, 2019, 9 pages.
Taiwanese Notice of Allowance related TW Application No. 107146837 dated Sep. 14, 2020, 4 pages.

CAP STRUCTURE

FIELD OF THE INVENTION

The present disclosure relates to semiconductor structures and, more particularly, to a cap structure and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of the line (BEOL) and middle of the line (MOL) metallization features, e.g., interconnects, due to the critical dimension (CD) scaling and process capabilities, as well as materials that are used to fabricate such structures.

For example, to manufacture interconnect structures for source and drain contacts, it is necessary to remove dielectric material adjacent to the gate structures. The removal of the dielectric material is provided by an etching process which also tends to erode the spacer material of the gate structure. That is, the low-k dielectric material used for the spacer or sidewalls of the gate structure can be eroded away in the downstream etching processes used to form the openings for the drain and source contacts. This loss of material will expose the metal material of the gate structure, resulting in a short between the metal material of the gate structure and the metal material used to form the contact, itself.

SUMMARY

In an aspect of the disclosure, a structure comprises: a gate structure composed of conductive gate material; sidewall spacers on the gate structure, extending above the conductive gate material; and a capping material on the conductive gate material and extending over the sidewall spacers on the gate structure.

In an aspect of the disclosure, a structure comprises: a gate structure composed of conductive gate material; sidewall spacers on the gate structure; an etch stop layer on the sidewall spacers; and a T-shaped bilayer cap on the conductive gate material and overhanging the sidewall spacers.

In an aspect of the disclosure, a method comprises: forming a gate structure composed of conductive gate material on a substrate; forming a capping material on the conductive gate material; forming sidewall spacers on the gate structure and the capping material; recessing the capping material below the sidewall spacers; and forming a second capping material on the first capping material, the second capping material overhanging the sidewall spacers.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a cap structure and methods of manufacture. More specifically, the present disclosure relates to a robust bilayer T-shaped sacrificial cap and methods of manufacture. Advantageously, by implementing the methods and structures described herein, the cap structure will protect a low-k spacer of a gate structure during downstream etching processes, preventing shorting between metal gate material and source/drain contacts.

In embodiments, the cap structure can be a T-shaped sacrificial cap of nitride material, which will protect the low-k spacer of the gate structure during downstream etching processes. In alternative embodiments, the T-shaped sacrificial cap can be other materials which will protect the low-k spacer of the gate structure during downstream etching processes. For example, the T-shaped sacrificial cap be composed of SiOC, which exhibits resistance to etching processes, e.g., HF etching processes. In further embodiments, the T-shaped sacrificial cap can be composed of a bilayer of nitride and SiOC.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
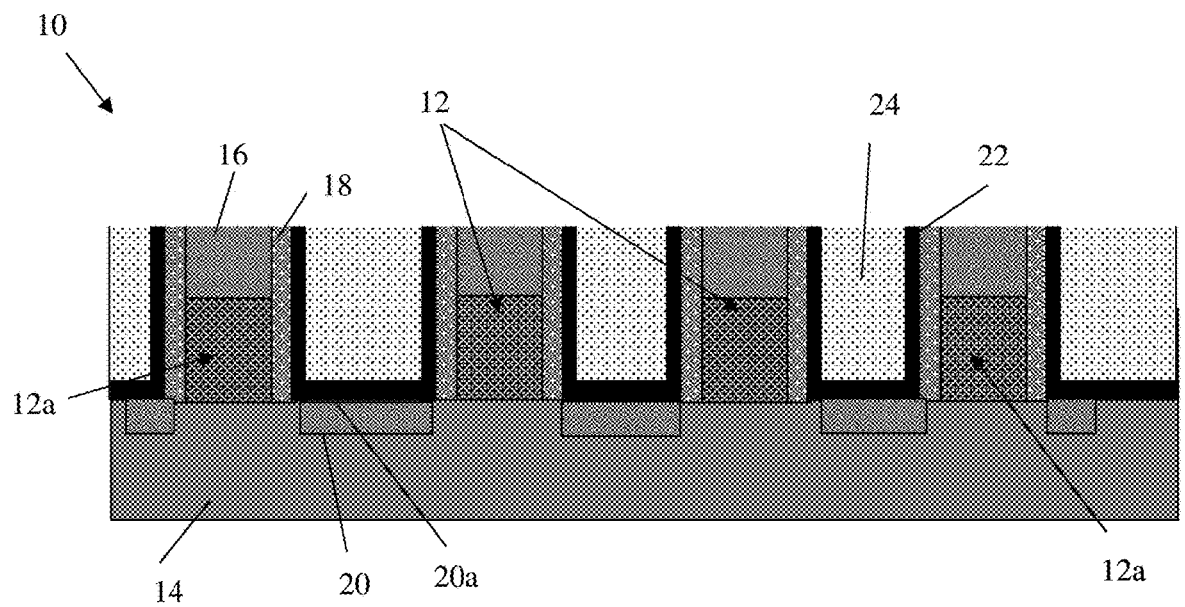
FIG. 1 shows a gate structure, amongst other features, and respective fabrication processes in accordance with aspects of the present disclosure.

FIG. 1 shows a structure and respective fabrication processes in accordance with aspects of the present disclosure. The structure 10 includes a plurality of gate structures 12 and dummy gate structures 12a formed on a substrate 14. The dummy gate structures 12a are provided at an edge of a fin structure, e.g., substrate 14. In embodiments, the gate structures 12 can be, e.g., a metal gate structure, composed of metal material and a dielectric material. In embodiments, the conductive material, e.g., metal material, can be tungsten and other work function metals depending on the desired characteristics and/or performance of the gate structure. The dielectric material can be a high-k dielectric material. In embodiments, the high-k dielectric gate material can be hafnium based dielectrics, as an example. In further embodiments, examples of such high-k dielectrics include, but are not limited: Al2O3, Ta2O3, TiO2, La2O3, SrTiO3, LaAlO3, ZrO2, Y2O3, Gd2O3, and combinations including multilayers thereof.

In embodiments, the gate structures 12 can be replacement gate structures formed on a planar substrate 14 or a fin structure composed of the substrate 14. As is known, the replacement gate fabrication process is well known such that no further explanation is required for an understanding to practice the structures by one of ordinary skill in the art. The substrate 14 can be any semiconductor material including, but not limited to, Si, SiGe, SiGeC, SiC, GaAs, InAs, InP, and other III/V or II/VI compound semiconductors.

The fin structure can be fabricated using known sidewall imaging transfer (SIT) techniques. In the SIT technique, for example, a mandrel is formed on the substrate 14 using conventional deposition, lithography and etching processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present disclosure.

Still referring to FIG. 1, the gate structures 12 (and dummy gate structures 12a) include a capping material 16 over the metal material. The capping material 16 can be a nitride material, for example, deposited using a conventional deposition process, e.g., chemical vapor deposition (CVD), followed by a patterning process. In embodiments, the capping material 16 can be other materials including SiN or other materials that are resistant to subsequent etching processes. Sidewalls or spacers 18 are provided on the sides of the gate structures 12, 12a and capping material 16. The sidewalls 18 have a height which extends above the gate material, e.g., conductive material. The sidewalls 18 also can be composed of any low-k dielectric material, e.g., SiOCN. In embodiments, the sidewalls 18 are formed by a conventional deposition process, e.g., CVD, followed by a conventional patterning process, i.e., isotropic etching process.

Source and drain regions 20 are formed adjacent to the gate structures 12, with the source or drain be shared amongst adjacent gate structures 12. In embodiments, the source and drain regions 20 are formed by conventional ion implantation processes or dopant processes. Silicide contacts 20a (regions) can be formed on the source and drain regions 20. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 20a in the active regions of the device.

A contact etch stop layer (CESL) 22 is disposed between adjacent diffusions (e.g., source/drain regions). The CESL 22 may comprise nitride or any other material that is harder (more resistant) to etch than the interlevel dielectric material 24, e.g., SiO2, formed on top of the CESL 22 and between adjacent gate structures 12. In embodiments, the interlevel dielectric material 24 can be a TEOS, which can be subjected to a planarization process, e.g., chemical mechanical polishing (CMP). The thickness of the interlevel dielectric material 24 can be about 100 nm to about 500 nm; although other dimensions are contemplated based on particular technology nodes, e.g., 110 nm.

Figure 2:
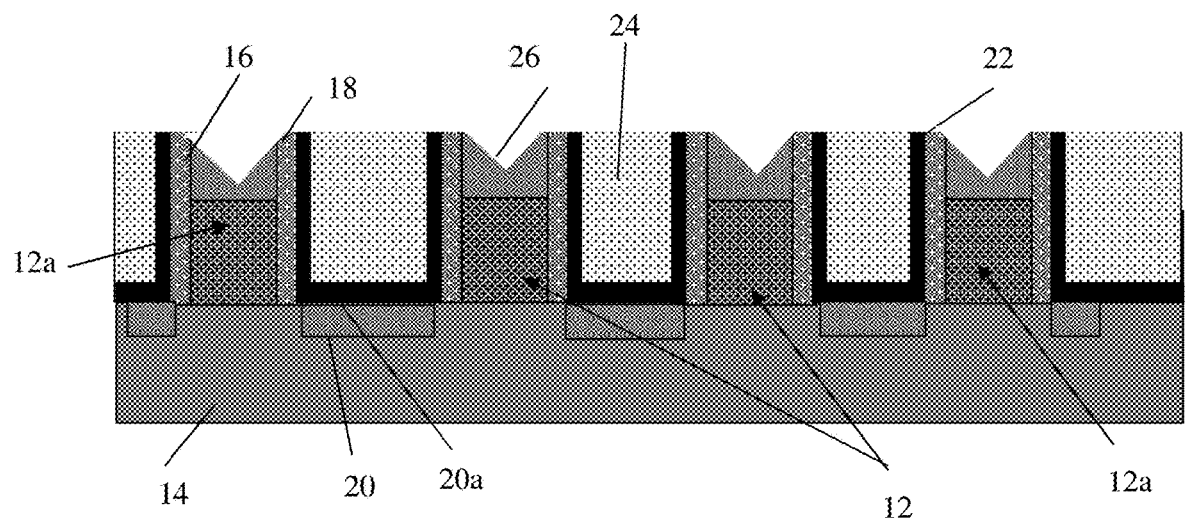
FIG. 2 shows a recessed capping material over the gate structure, amongst other features, and respective fabrication processes in accordance with aspects of the present disclosure.

In FIG. 2, the capping material 16 is recessed between the sidewalls 18. In embodiments, the recess 26 can be provided by using, e.g., a selective etching process which does not require a mask. The capping material 16 can be recessed to below a top surface of the sidewalls 18 and, more specifically, about ⅔ of a height of the capping material 16 can be removed. It should be recognized by those of skill in the art that other recess depths are contemplated herein. For example, more or less than ⅔ of the capping material 16 can be removed, noting that the capping material 16 should still be present over the metal material of the gate structures 12, 12a to provide protection from subsequent downstream processes. Different nitride RIEs can be implemented to have different shapes and, hence, different recess depths for the capping material 16.

Figure 3A:
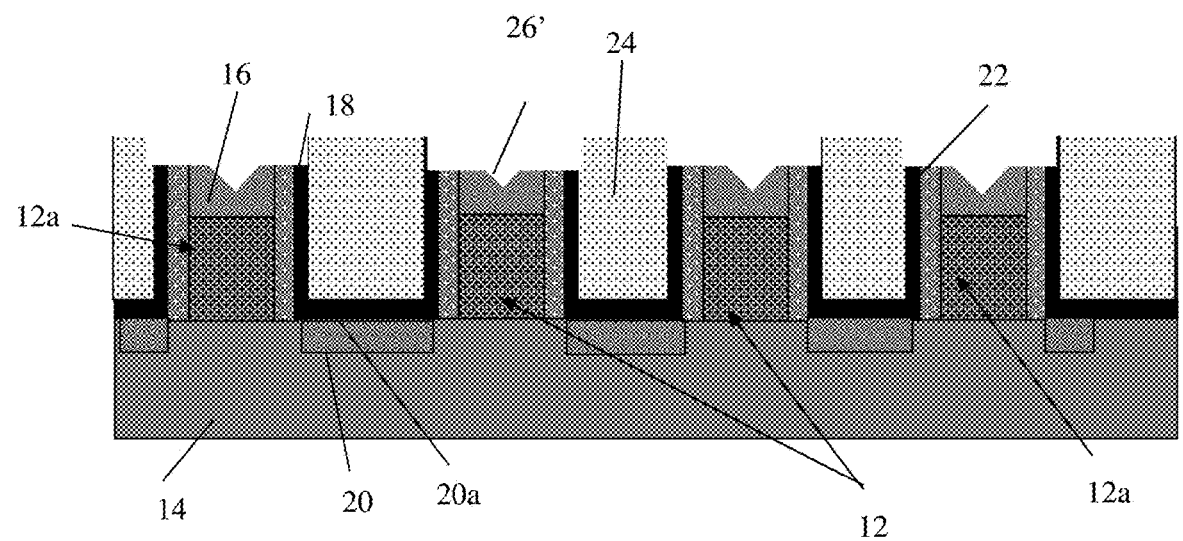
FIG. 3A shows an enlarged recess over the gate structure, amongst other features, and respective fabrication processes in accordance with aspects of the present disclosure.

As shown in FIG. 3A, the sidewalls 18 and, optionally, the CESL 22 can be recessed to the same level of the capping material 16. In embodiments, the sidewalls 18 and the CESL 22 can be recessed by a selective etching process, without the need for a mask. In embodiments, the etching process results in an enlarged recess 26'. The etching process can be a remote plasma assisted dry etch process which involves the simultaneous exposure to H2, NF3 and NH3 plasma by-products. In this type of etching process, remote plasma excitation of the hydrogen and fluorine species allows plasma-damage-free substrate processing. This type of etch is also largely conformal and selective towards silicon oxide layers but does not readily etch other materials, e.g., polycrystalline, etc.

Figure 3B:
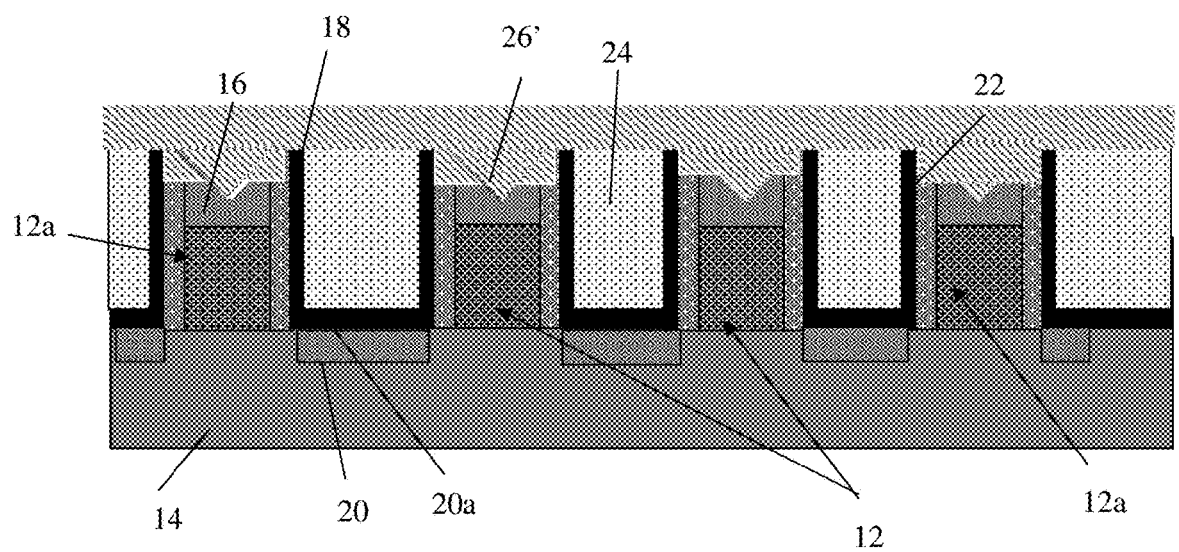
FIG. 3B shows an optional embodiment, in which a CESL is not etched or recessed.

FIG. 3B shows an optional embodiments, in which the CESL 22 is not etched or recessed. In this scenario, a smaller recess 26" is created, in which the steps of FIGS. 4-7 can follow directly therefrom. That is, the material 28 as shown in FIG. 4 can be deposited within the smaller recess 26" defined by the CESL 22 (as also shown in FIG. 3B), followed by the remaining processes shown in FIGS. 5-7.

Figure 4:
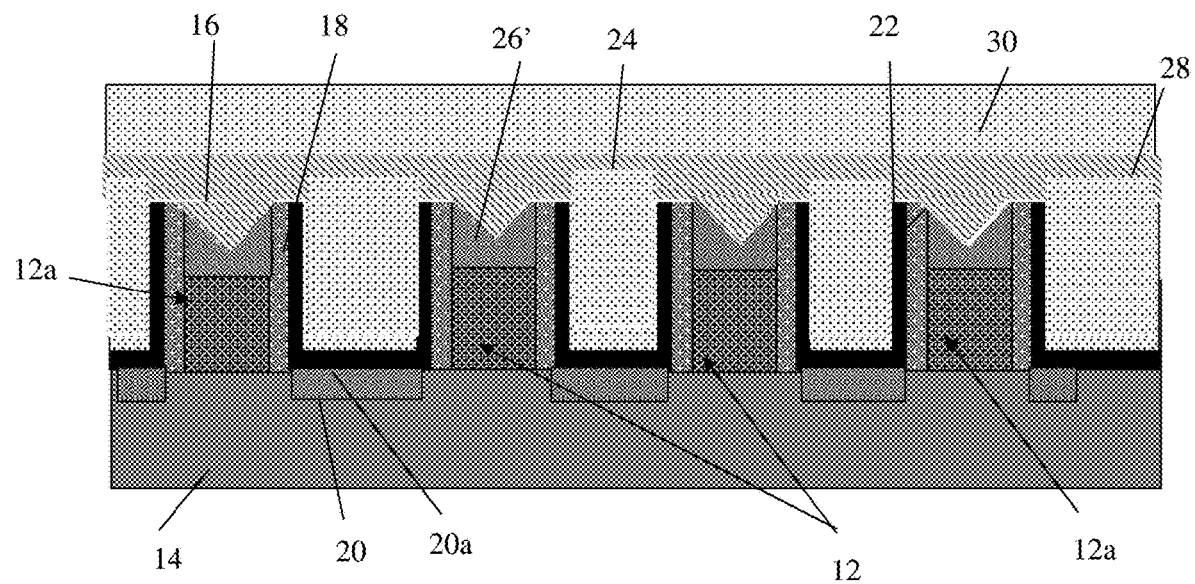
FIG. 4 shows a fill material within the recess, amongst other features, and respective fabrication processes in accordance with aspects of the present disclosure.

In FIG. 4, a material 28 is deposited within the recesses 26' using, e.g., conventional deposition processes. In embodiments, the material 28 can be SiOC or other materials that are resistant to subsequent etching processes and, more specifically, during downstream HF and other etch chemistries. For example, the material 28 can be a SPARC k4.9. Preferably, the material 28 would be material which does not form a seam in the cap during a deposition process. In embodiments, the material 28 can be deposited using a conventional CVD process to a thickness of about 20 to about 100 nm and, more preferably, about 40 nm. An interlevel dielectric material 30 (e.g., SiO2) can be deposited on the material 28, followed by a CMP process. In embodiments, the interlevel dielectric material 30 can be TEOS.

Figure 5:
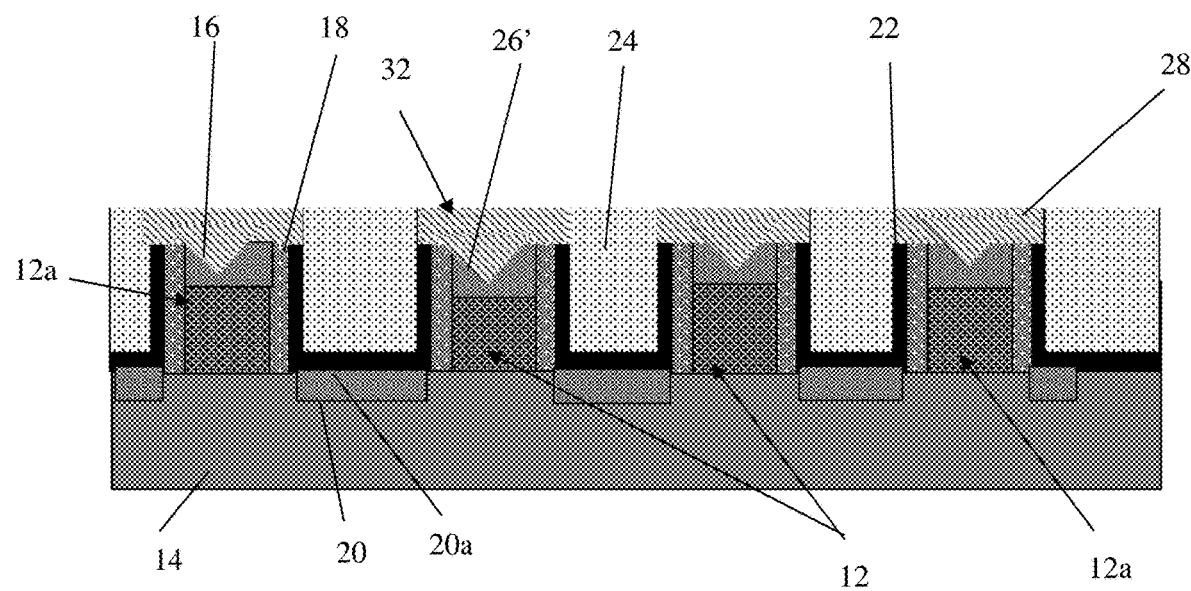
FIG. 5 shows the fill material with a planarized surface, amongst other features, and respective fabrication processes in accordance with aspects of the present disclosure.

As shown in FIG. 5, the interlevel dielectric material 30 (not shown in this figure) and the material 28 are subjected to a planarization process, e.g., CMP or a non-selective etch back process. In embodiments, the planarization process will stop on the material 28 at a height of the interlevel dielectric material 24. In this way, a T-shaped sacrificial cap 32 is formed, composed of nitride and SiOC, as an example. It should be recognized, though, that the T-shaped sacrificial cap 32 can be a single material or multiple materials, with the top material etch resistant to additional downstream chemistries. As further noted, the T-shaped sacrificial cap 32 will overhang the sidewalls 18 and the CESL 22.

Figure 6:
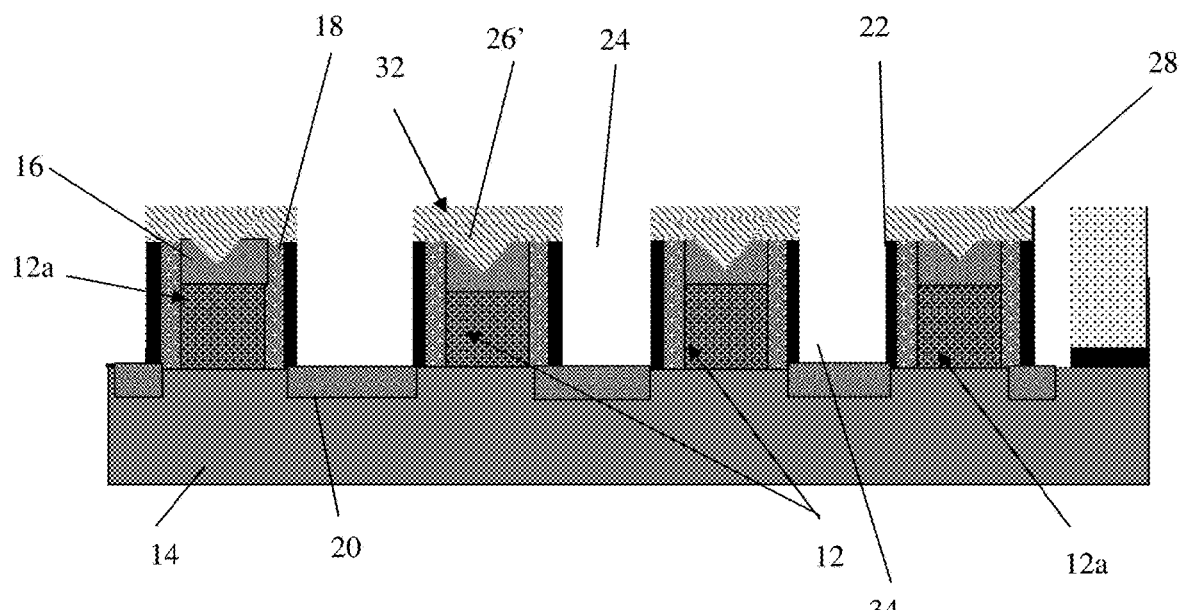
FIG. 6 shows contact openings adjacent to the gate structures, amongst other features, and respective fabrication processes in accordance with aspects of the present disclosure.

In FIG. 6, the interlevel dielectric material 24 are removed between the gate structures 12, 12a to form contact openings 34. In embodiments, the interlevel dielectric material 24 can be removed by a conventional RIE process that is selective to the material of the interlevel dielectric material 24. For example, a resist formed over the interlevel dielectric material 24 is exposed to energy (light) to form a pattern (opening). An etching process with a selective chemistry, e.g., reactive ion etching (RIE), will be used to form one or more contact openings 34 in the interlevel dielectric material 24 through the openings of the resist. The resist can then be removed by a conventional oxygen ashing process or other known stripants.

As shown in FIG. 6, the T-shaped sacrificial cap 32 and, more specifically, the layer of material 28 of the T-shaped sacrificial cap 32 will protect the sidewalls 18 during this etching process such that metal material of the gate structures 12 will not be exposed. In this way, contact material for the source/drain regions will not short to the metal material of the gate structures 12.

Figure 7:
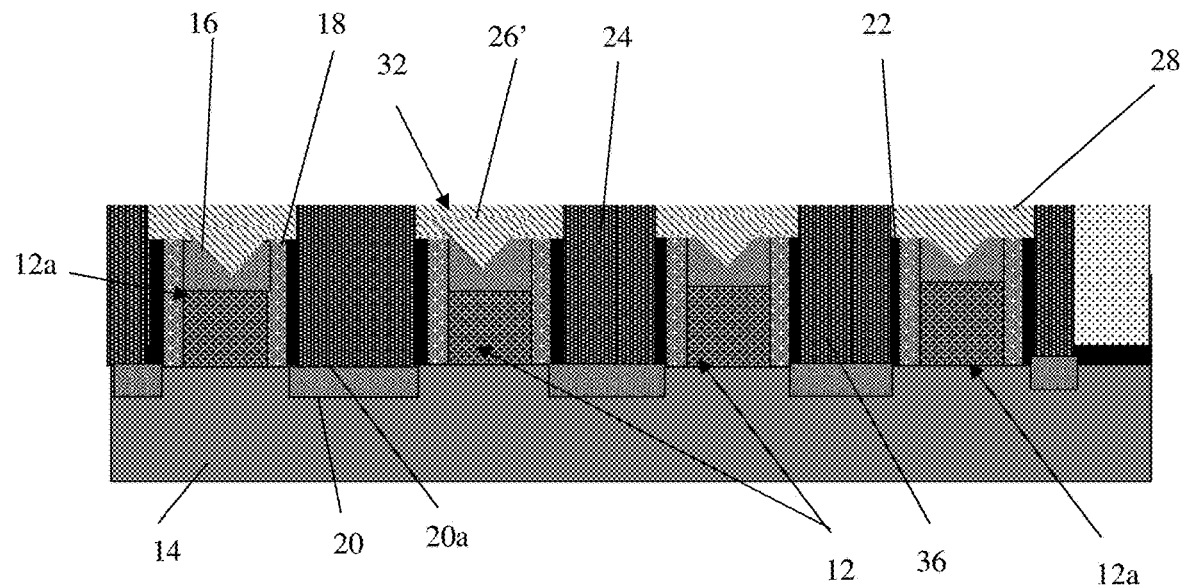
FIG. 7 shows contacts in the contact openings, amongst other features, and respective fabrication processes in accordance with aspects of the present disclosure.

As shown in FIG. 7, following the resist removal, contact material 36 can be deposited by any conventional deposition processes, e.g., chemical vapor deposition (CVD), within the contact openings 34. In embodiments, the contact material 36 can be any contact material used in semiconductor fabrication processes such as, e.g., tungsten, aluminum, etc. Any residual material on the surface of the insulator material can be removed by conventional chemical mechanical polishing (CMP) processes. In this way, in the subsequent contact formation steps, the contact material 36 for the source/drain regions will not short to the metal material of the gate structures 12.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method comprising:
forming a gate structure composed of conductive gate material;
forming a first capping material on the conductive gate material;
forming sidewall spacers on the gate structure and the first capping material;
recessing the first capping material below the sidewall spacers; and
forming a second capping material on the first capping material, the second capping material overhanging the sidewall spacers; and
forming an etch stop layer on the sidewall spacers, on a side opposing conductive gate material of the gate structure, the sidewall spacers and the etch stop layer being formed only on sides of the gate structure and not extending underneath the conductive gate material of the gate structure.

2. The method of claim 1, further comprising planarizing or etching back the second capping material to overhang the sidewall spacers, and forming a T-shaped capping structure composed of the first capping material and the second capping material.

3. The method of claim 2, wherein the first capping material is nitride material and the second capping material is an etch resistant material that is a different material than the nitride material.

4. The method of claim 1, wherein the first capping material is formed directly on the conductive gate material and comprises a recessed portion between the sidewall spacers on the gate structure.

5. The method of claim 4, wherein the second capping material is formed within the recessed portion of the first capping material and extends over and in direct contact with a top surface of the sidewall spacers on the gate structure.

6. The method of claim 5, wherein the second capping material is T-shaped and the second capping material is a top material that is resistant to etch chemistries and which overhangs over the sidewall spacers.

7. The method of claim 6, wherein the first capping material directly contacts the conductive gate material and is located between the sidewall spacers.

8. The method of claim 1, further comprising forming contacts adjacent to the gate structure, the contacts being separated from the conductive gate material of the gate structure by at least the sidewall spacers and the second capping material which overhangs the sidewall spacers.

9. The method of claim 1, further comprising planarizing the second capping material and, wherein:
the sidewall spacers and a portion of the first capping material are planarized with one another,
the recessed portion of the first capping material is below a top surface of the etch stop layer and the sidewall spacers, and the second capping layer is directly on the top surface of the etch stop layer and the sidewall spacers and directly contacting a sidewall of the interlevel dielectric material.

10. The method of claim 1, wherein the sidewall spacers are formed in contact with the conductive gate material and the etch stop layer is formed in contact with the sidewall spacers, and separated from the conductive gate material by the sidewall spacers.

11. The method of claim 1, wherein the etch stop layer is not recessed, and the second capping material is deposited on and contacts an inner sidewall of the etch stop layer and a top surface of the sidewall spacers.

12. A method, comprising:
    forming a gate structure composed of conductive gate material;
    forming sidewall spacers on the gate structure and having a top surface extending above a top surface of the conductor material;
    forming an etch stop layer on the sidewall spacers, on a side opposing the conductive gate material; and
    forming a T-shaped bilayer cap on the conductive gate material, the T-shaped bilayer cap comprising a first capping material positioned within the sidewall spacers and having a recessed portion lower than a top surface of the sidewall spacers and a second capping material within the recessed portion and further directly contacting and overhanging the sidewall spacers,
    wherein the etch stop layer is not lowered, and the second capping material is deposited on and contacts an inner sidewall of the etch stop layer and a top surface of the sidewall spacers.

13. The method of claim 12, wherein the forming of the T-shaped bilayer cap comprises:
    forming the first capping material between the sidewall spacers;
    recessing the first capping material between the sidewall spacers such that the recessed portion is lower than the top surface of the sidewall spacers;
    lowering the sidewall spacers to a same level as the first capping material, which enlarges the recessed portion; and
    forming the second capping material within the enlarged recessed portion and overhanging the sidewall spacers.

14. The method of claim 12, wherein the sidewall spacers are formed in contact with the conductive gate material of the gate structure and the etch stop layer is formed in contact with the sidewall spacers, and separated from the conductive gate material by the sidewall spacers.

15. A method, comprising:
    forming a gate structure composed of conductive gate material;
    forming sidewall spacers on the gate structure and having a top surface extending above a top surface of the conductor material;
    forming an etch stop layer on the sidewall spacers, on a side opposing the conductive gate material; and
    forming a T-shaped bilayer cap on the conductive gate material, the T-shaped bilayer cap comprising a first capping material positioned within the sidewall spacers and having a recessed portion lower than a top surface of the sidewall spacers and a second capping material within the recessed portion and further directly contacting and overhanging the sidewall spacers,
    wherein the sidewall spacers and the etch stop layer are formed only on sides of the gate structure and do not extend underneath the conductive gate material of the gate structure.

* * * * *